United States Patent
Rutten

(10) Patent No.: US 6,777,963 B2
(45) Date of Patent: Aug. 17, 2004

(54) CHIP-MOUNTED CONTACT SPRINGS

(75) Inventor: Ivo Wilhelmus Johannes Marie Rutten, Saratoga, CA (US)

(73) Assignee: Koninklijke Philips Electronics N.V., Eindhoven (NL)

(*) Notice: Subject to any disclaimer, the term of this patent is extended or adjusted under 35 U.S.C. 154(b) by 273 days.

(21) Appl. No.: 10/005,689

(22) Filed: Nov. 8, 2001

(65) Prior Publication Data

US 2003/0085722 A1 May 8, 2003

(51) Int. Cl.[7] ............................................. G01R 31/02
(52) U.S. Cl. ..................................................... 324/754
(58) Field of Search ................................ 324/754, 755, 324/761, 763, 158.1, 757, 758, 762, 765; 374/137

(56) References Cited

U.S. PATENT DOCUMENTS

| | | | |
|---|---|---|---|
| 5,441,343 A | * 8/1995 | Pylkki et al. | ............... 374/137 |
| 6,075,373 A | 6/2000 | Iino | |
| 6,169,410 B1 | 1/2001 | Grace et al. | |
| 6,597,187 B2 | * 7/2003 | Eldridge et al. | ............. 324/754 |

FOREIGN PATENT DOCUMENTS

EP        0 755 071 A2    7/1996

OTHER PUBLICATIONS (co pending application) "Preconditioned Integrated Circuit for Integrated Circuit Testing".
"Introducing WOW Technology", http://www.formfactor-.com/about/wow/wow_pg2.html.
"Introducing WOW Technology", http://www.formfactor-.com/about/wow/wow_pg5.html.
"Focus on FormFactor", The Final Test Report, vol. 12, No. 09, Sep. 2001, Ikonix Corp. P.O. Box 1938, Lafayette, CA 94549–1938.
"Flip–Chip Bonding on 6–um Pitch using Thin–Film Microspring Technology", Donald L. Smith et al., Xerox Palo Alto Research Center, Proceedings, 48th Electronic Components and Technology Conference, IEEE, May 1998.

* cited by examiner

Primary Examiner—David A. Zarneda
Assistant Examiner—Trung Q. Nguyen
(74) Attorney, Agent, or Firm—Michael J. Ure

(57) ABSTRACT

Bonding wire is formed into an inverted "V" shape by bonding both ends of a bonding wire to adjacent points on an integrated circuit, the vertex of the "V" shape forming a contact point for contacting another integrated circuit, or other device. One end of the bonding wire is bonded to a specified point on the integrated circuit, the bonding head is raised, and then lowered to an immediately adjacent point to effect the second bonding, thus forming the inverted V shape. This V shape, being bonded at both ends, is mechanically stable, is resilient in form, and allows for the use of resilient, or non-resilient bonding wire. The vertex of the V shape forms a point or surface for contacting another integrated circuit, or other device, for communicating signals to and from the device to which the bonding wire is bonded.

20 Claims, 2 Drawing Sheets

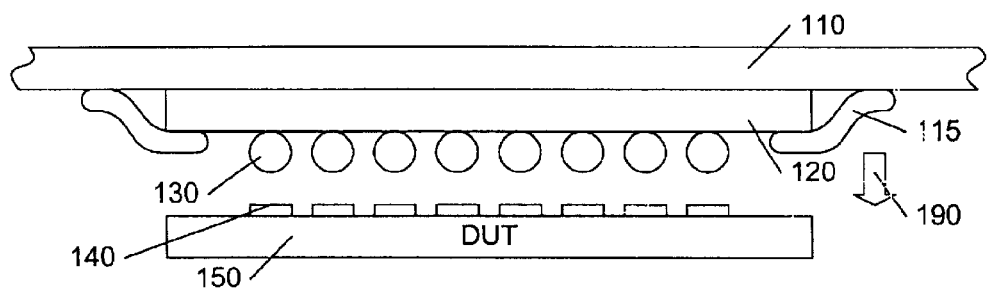
FIG. 1 [Prior Art]
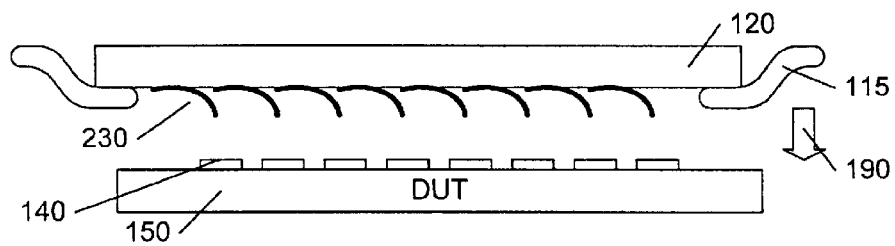
FIG. 2 [Prior Art]
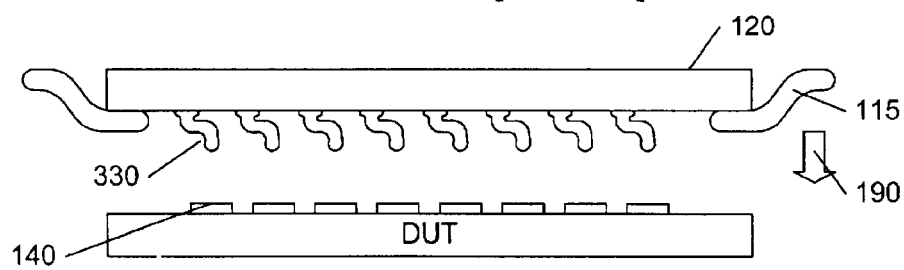
FIG. 3 [Prior Art]

CHIP-MOUNTED CONTACT SPRINGS

BACKGROUND OF THE INVENTION

1. Field of the Invention

This invention relates to the field of integrated circuit technology, and in particular to contact springs for use in an integrated circuit test probe.

2. Description of Related Art

EP 0755071 discloses a test device that comprises an integrated circuit (hereinafter a "probe IC") with protruding "solder bumps" that are designed to contact pads on a corresponding integrated circuit that is to be tested (hereinafter a "DUT", Device Under Test), and is incorporated by reference herein. The probe IC preferably contains circuitry to facilitate the testing of the DUT, and the bumps provide the communication of power and test signals and corresponding responses, to and from the DUT. The bumps are fabricated on the probe IC to correspond to the location of test points on the DUT. Because multiple test points must be contacted simultaneously, the protrusion of each bump must be substantially equal, to form a uniform contact plane.

An alternative to the use of solder-bumps is the use of pre-formed balls that are mounted to the planar surface of the probe IC, as illustrated in FIG. 1. Uniformly sized balls 130 are mounted on a probe IC 120, which is mounted on a test device substrate 110. Connections 115 provide communication between the probe IC 120 and other test equipment (not shown), via circuitry on the substrate 110. If the balls 130 are of uniform size, a uniform contact plane is provided, as illustrated in FIG. 1 by the dashed line 101. When the balls 130 are brought in contact with pads 140 on a DUT 150, via a movement 190 of the test structure that includes the probe IC 120 toward the DUT 150, or a movement of the DUT 150 toward the probe IC 120, contact is established, and testing may be performed by communicating test stimuli and responses to and from the DUT 150. The use of uniform sized balls, however, limits the pitch, or test-pad-density, that can be achieved.

FIG. 2 illustrates another alternative to the solder-bump or uniform-ball contact techniques, wherein spring levers 230 on the probe IC 120 are used to contact the pads 140 of the DUT 150. Using thin-film microspring technology, a pitch as dense as 6 micrometers can be achieved, compared to an approximate 400 micrometer limit to the aforementioned uniform-ball contact technique. The cost and complexity of fabricating microsprings, however, limits the application of this technique for widespread use. Additionally, the extent of the spring element 230 below the probe IC 120 using microspring technology is limited, and may not provide sufficient clearance between the components of the test structure, such as the connectors 115 between the probe IC 120 and the substrate 110, and the DUT 120.

An alternative to the use of microsprings is the use of bonding wire that is treated to be resilient. "THE FINAL TEST REPORT", Vol. 12, No. 9, Sep. 2001, introduces such a technique developed by FormFactor, Inc. of Livermore, Calif. In this approach, the bonding wire 330 is attached to a bond pad at one end, and formed into an "S" shape to provide a resilient spring, as illustrated in FIG. 3. The resilient spring shape provides tolerance for a non-uniform contact plane, and can be formed to a length that sufficiently clears the connectors 115. Consistently forming an S shape with a free-standing bonding wire, however, is a nonstandard use of a bonding wire machine, and requires a two-step process. To form the S shape, the bonding wire must be non-resilient; to provide the required resiliency, the resilient coating must be subsequently applied. As multiple springs are formed, maintaining the required shape in the non-resilient bonding wire may be problematic, and the subsequent application of the resilient coating to a field of S shaped bonding wire springs is also likely to be problematic.

BRIEF SUMMARY OF THE INVENTION

It is an object of this invention to provide a method and system that facilitates contact between two integrated circuit devices. It is a further object of this invention to provide a method and system that facilitates the testing of an integrated circuit. It is a further object of this invention to provide a method and system that facilitates contact between two integrated circuits that uses conventional manufacturing processes.

These objects and others are achieved by providing a method and system wherein bonding wire is formed into an inverted "V" shape by bonding both ends of a bonding wire to adjacent points on an integrated circuit. One end of the bonding wire is bonded to a specified point on the integrated circuit, the bonding head is raised, and then lowered to an immediately adjacent point to effect the second bonding, thus forming the inverted V shape. This V shape, being bonded at both ends, is mechanically stable, is resilient in form, and allows for the use of resilient, or non-resilient bonding wire. The vertex of the V shape forms a point or surface for contacting another integrated circuit, or other device, for communicating signals to and from the device to which the bonding wire is bonded.

BRIEF DESCRIPTION OF THE DRAWINGS

The invention is explained in further detail, and by way of example, with reference to the accompanying drawings wherein:

FIG. 1 illustrates an example prior art test device wherein contact between two integrated circuits is effected vial ball-shaped contacts.

FIG. 2 illustrates an example prior art test device wherein contact between two integrated circuits is effected via microsprings.

FIG. 3 illustrates an example prior art test device wherein contact between two integrated circuits is effected via S-shaped bonding wire.

Throughout the drawings, the same reference numerals indicate similar or corresponding features or functions.

DETAILED DESCRIPTION OF THE INVENTION

Figure 4:
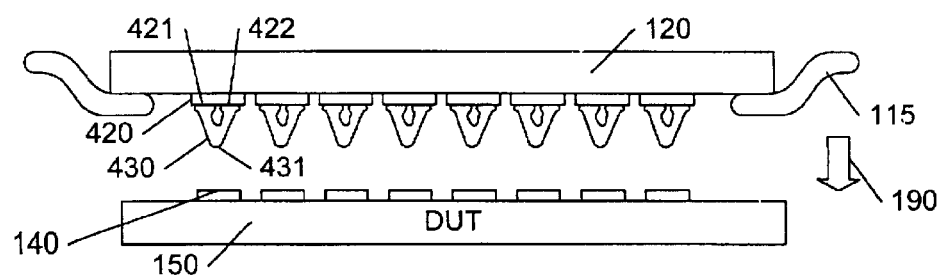
FIG. 4 illustrates an example test device wherein contact between two integrated circuits is effected via adjacent-bonded bonding wire contacts in accordance with this invention.

FIG. 4 illustrates an example test device wherein contact between two integrated circuits 120–150 is effected via adjacent-bonded bonding wire contacts 430 in accordance with this invention. To form the bonding wire contact 430, the bonding wire is bonded to a first point 421 on a bond pad 420 on a probe IC 120, then bonded to a second point 422 on the same bond pad 420. Consistent with conventional bonding techniques, the bonding head is raised between the first and second bonds, and thus this adjacent bonding process forms an inverted "V" shape.

As is known in the art, a bonding machine is characterized by parameters that include a minimum spacing between consecutive bonding points, and this minimum spacing is preferably used to form the contact 430, to provide for a minimum pitch between contacts 430. Also, conventional bonding machines are routinely tested at this minimum spacing, and thereby statistics can be readily obtained to assess the variances of this process for a given bonding machine, or for different bonding wire materials.

The inverted V shape of the contact 430 is particularly well suited as a spring terminal for contacting bond pads 140 of another IC 150 because the vertex 431 of the V shape forms a fairly well defined point for contacting the pad 140, and because the V shape forms an inherently stable form. That is, with two ends of the bonding wire being fastened to the pad 420, and the length of the bonding wire being kept to a minimum, a substantial force would be required to deflect the vertex 431 of the contact device 430 from its formed location. This inherent stability allows for a greater contact force when the probe IC 120 is brought in contact with the device under test 150 (in the direction 190) without risk of deformation of the contact device 430, and is particularly well suited for applications in which a coating (such as an oxide layer) on the pad 140 of the DUT 150 must be penetrated in order to form a reliable contact between the device 430 and the pad 140.

The rigid triangular shape of the contact device 430 that is formed by the dual bonded wire also augments the resiliency of the bonding wire. That is, given the same bonding wire material, the resiliency of a dual bonded triangular shape is inherently greater than the resiliency of a single bonded shape, such as the S shaped springs of the prior art. Therefore, in this invention, conventional bonding wire, which is relatively non-resilient, may be used, while still providing a relatively resilient spring structure, based on the shape of the dual bonded contact 430. In a preferred embodiment, a resilient bonding wire is preferably used, to facilitate repeated uses of the probe IC 120 during production testing. It is significant to note that the bonding wire material may be resilient, or, a resilient coating may be added to relatively non-resilient bonding wire. The inherently stable shape of the contact device 430 allows a resilient coating to be added to a plurality of formed contact devices 430 easily, without fear of deformation of the relatively non-resilient bonding wire during the process.

These and other advantages and characteristics of a dual bonded triangular shaped contact device 430 will be evident to one or ordinary skill in the art in view of this disclosure, as well as the use of other shapes, such as "U" shapes and arcs. Although a preferred embodiment of the contact terminal 430 is a short length of bonding wire that is bonded between two immediately adjacent points 421, 422 on a common bond pad 420, as discussed above, other shapes and forms may be used to achieve alternative benefits or characteristics. For example, if additional flexibility is required to allow for a non-planar contact surface, the length of the bonding wire may be increased, the shape of the bonding wire between the two points may be changed to an arc, or the spacing between the bonding points may be increased.

Figure 5A:
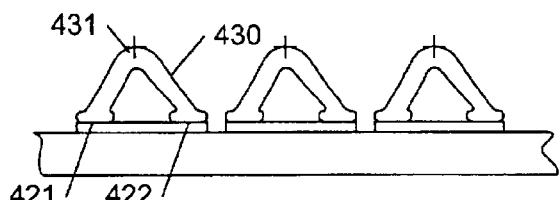
FIGS. 5A–5B illustrate an example placement of adjacent-bonded contact terminals on an integrated circuit in accordance with this invention.
Figure 5B:
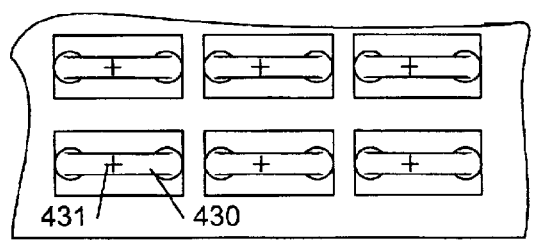

FIGS. 5A–5B illustrate an example placement of adjacent-bonded contact terminals 430 on an integrated circuit 120 in accordance with this invention. The contact terminals 430 are illustrated as providing a relatively uniform placement of contact points 431.

Figure 6A:
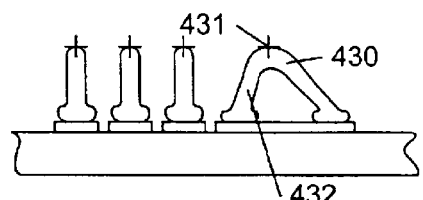
FIGS. 6A–6B illustrate another example placement of adjacent-bonded contact terminals on an integrated circuit in accordance with this invention.
Figure 6B:
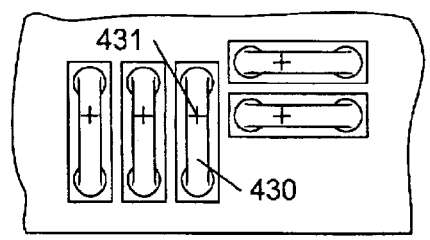

FIGS. 6A–6B illustrate another example placement of adjacent-bonded contact terminals 430 on an integrated circuit 120 in accordance with this invention. In this example, the vertically oriented contact terminals 430 provide a minimal horizontal pitch, while the horizontally oriented contact terminals 430 provide a minimal vertical pitch.

FIGS. 6A–6B also illustrate example contact terminals 430 that form asymmetric triangles. This asymmetry can be used to provide particular mechanical characteristics, or to provide a particular placement of the vertex 431 on select terminals 430. For example, an asymmetric contact terminal 430 will generally allow for a greater vertical contact force, based on the shorter, more vertical segment 432, although it will provide a lesser inherent spring function, compared to a triangle with equal length segments.

Although a regular placement of contacts 430 is illustrated in each of the figures, it will be evident to one of ordinary skill in the art that the contacts 430 may be placed in whatever configuration is required to correspond to the location of pads 140 on the device under test 150.

The foregoing merely illustrates the principles of the invention. It will thus be appreciated that those skilled in the art will be able to devise various arrangements which, although not explicitly described or shown herein, embody the principles of the invention and are thus within its spirit and scope. For example, although the contact device 430 of this invention is particularly well suited for use in a test probe, for temporary contact to a device under test, it may also be used in applications that require a permanent contact between two devices. Depending upon the application, the contact device 430 may be soldered, or otherwise affixed to corresponding pads 140 on another device 150, or, a clamp mechanism may be used to apply a compression force between the devices 120 and 150 to provide the contact, as in the test examples discussed above. These and other system configuration and optimization features will be evident to one of ordinary skill in the art in view of this disclosure, and are included within the scope of the following claims.

I claim:

1. A test probe comprising:

one or more contact devices that are designed to provide a contact point for establishing an electrical contact between each contact device of the one or more contact devices and a device-under-test, wherein each contact device includes a bonding wire that is bonded to a first point and a second point on the test probe, and the contact point of each contact device is located on the bonding wire that forms the contact device, between the first point and the second point.

2. The test probe of claim 1, wherein the first point and the second point on the test probe of each contact device are substantially adjacent.

3. The test probe of claim 2, wherein the test probe includes one or more bond pads, and the first point and the second point of each contact device on the test probe are located on a common bond pad of the one or more bond pads.

4. The test probe of claim 3, wherein the test probe includes an integrated circuit substrate, and the one or more contact devices are located on the integrated circuit substrate.

5. The test probe of claim 4, wherein the test probe includes one or more test circuits that are operably coupled to the one or more contact devices.

6. The test probe of claim 5, wherein at least one of the one or more test circuits is located on the integrated circuit substrate.

7. The test probe of claim 1, wherein the test probe includes one or more bond pads, and the first point and the second point of each contact device on the test probe are located on a common bond pad of the one or more bond pads.

8. The test probe of claim 1, wherein the test probe includes an integrated circuit substrate, and the one or more contact devices are located on the integrated circuit substrate.

9. The test probe of claim 8, wherein the test probe includes one or more test circuits that are operably coupled to the one or more contact devices.

10. The test probe of claim 9, wherein at least one of the one or more test circuits is located on the integrated circuit substrate.

11. The test probe of claim 1, wherein the bonding wire includes a resilient material.

12. An integrated circuit comprising:
a plurality of bond pads, and
one or more contact devices, wherein
each of the one or more contact devices includes a bonding wire that is bonded to a first point and a second point on the plurality of bond pads.

13. The integrated circuit of claim 12, wherein the first point and the second point of the bonding wire are located on a common bond pad.

14. The integrated circuit of claim 12, wherein the first point of the bonding wire is located adjacent the second point of the bonding wire.

15. The integrated circuit of claim 12, wherein the bonding wire is formed between the first point and the second point to produce a vertex that facilitates electrical contact between the contact device and another integrated circuit.

16. The integrated circuit of claim 12, wherein the bonding wire includes a resilient material.

17. A method of manufacturing an integrated circuit, including:
forming a plurality of bond pads on an integrated circuit substrate,
attaching at least one contact device on the integrated circuit substrate by bonding a bonding wire to a first point and to a second point within the plurality of bond pads, the bonding wire forming the at least one contact device.

18. The method of claim 17, wherein the first point and the second point of the at least one contact device are located on a common bond pad.

19. The method of claim 17, wherein the first point of the at least one contact device is adjacent to the second point of the at least one contact device.

20. The method of claim 17, wherein the bonding wire is formed between the first point and the second point to produce a vertex that is substantially above an upper-layer plane of the integrated circuit substrate.

* * * * *